United States Patent [19]

Assard

[11] 4,274,055
[45] Jun. 16, 1981

[54] SYNTHESIZED SINUSOID GENERATOR

[75] Inventor: Gerald L. Assard, Waterford, Conn.

[73] Assignee: The United States of America as represented by the Secretary of the Navy, Washington, D.C.

[21] Appl. No.: 20,902

[22] Filed: Mar. 16, 1979

[51] Int. Cl.³ .................... H03B 19/00; H03B 27/00
[52] U.S. Cl. ........................................ 328/14; 328/56; 328/158
[58] Field of Search ................... 328/14, 158, 159, 56, 328/55

[56] References Cited

U.S. PATENT DOCUMENTS

| | | | |
|---|---|---|---|
| 3,660,766 | 5/1972 | Hilliard | 328/14 |
| 3,828,207 | 8/1974 | Shaw | 328/14 X |
| 3,838,414 | 9/1974 | Wiles | 328/14 X |

Primary Examiner—John S. Heyman
Attorney, Agent, or Firm—Richard S. Sciascia; Arthur A. McGill; Prithvi C. Lall

[57] ABSTRACT

A synthesized sinusoid generator for delivering to an acoustic driver high power of a discrete spectral component from a spectrum including the discrete spectral component and its harmonics. The generator uses a plurality of unity gain switching amplifiers and involves summing various stages thereof at full power. This is accomplished by switching on and off various unity gain switching amplifiers as a function of time of the fundamental, thus necessitating only generation of the fundamental frequency and a delay network to switch on and off the designated unity gain switching amplifiers.

8 Claims, 15 Drawing Figures

5 LEVEL SYNTHESIZED SINUSOID

SPECTRUM OF 5 LEVEL SYNTHESIZED SINUSOID

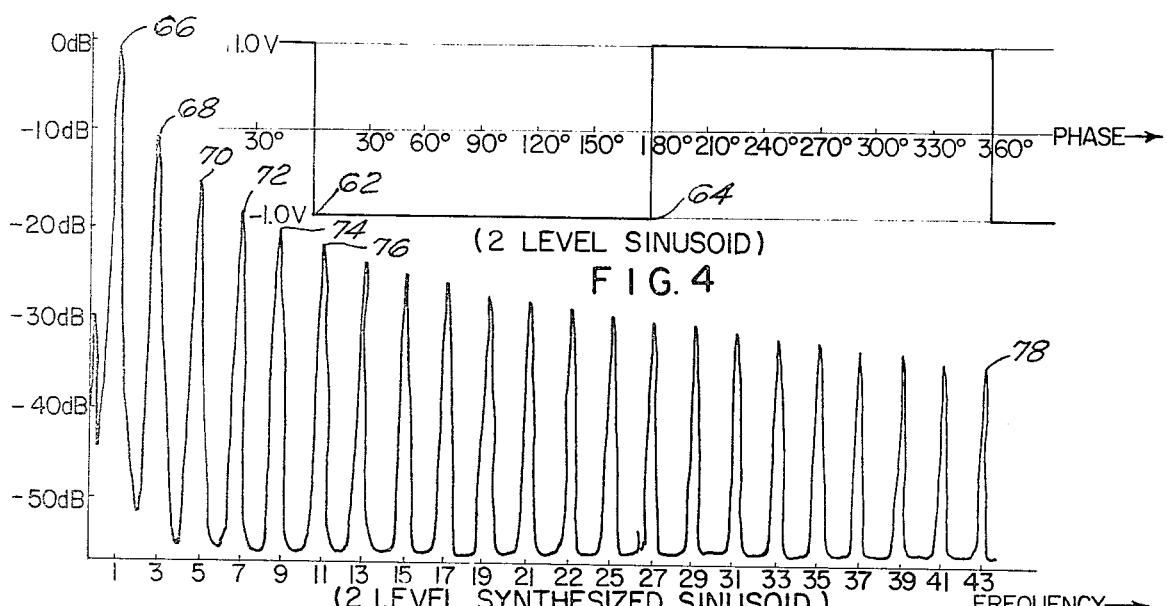
FIG. 4 (2 LEVEL SINUSOID)
FIG. 5 (2 LEVEL SYNTHESIZED SINUSOID)
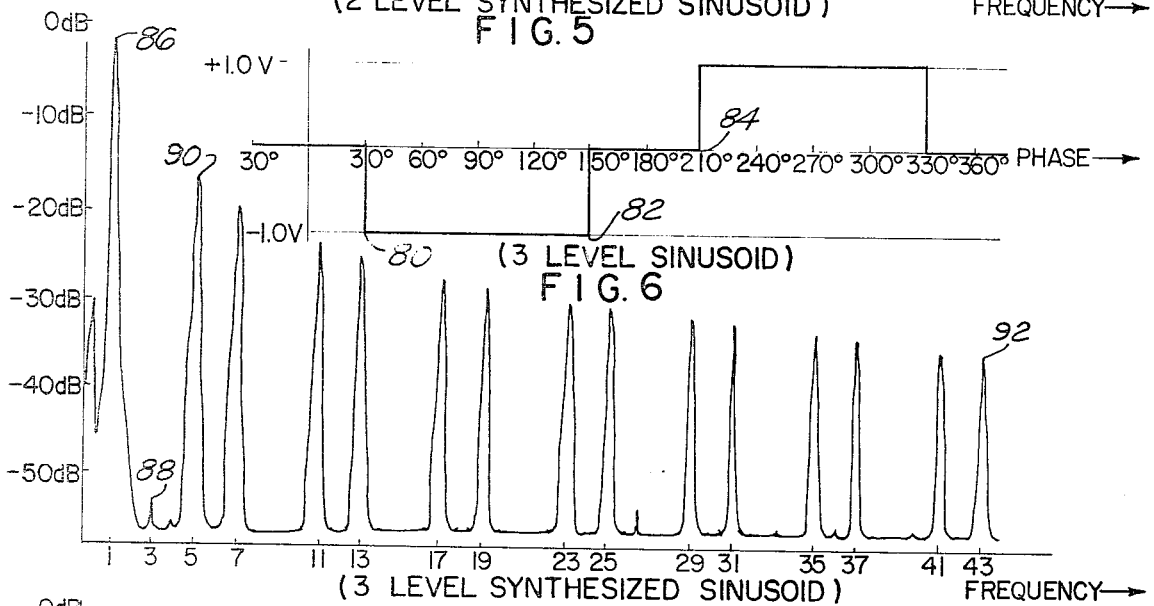
FIG. 6 (3 LEVEL SINUSOID)
FIG. 7 (3 LEVEL SYNTHESIZED SINUSOID)
FIG. 8 (5 LEVEL SINUSOID)
FIG. 9 (5 LEVEL SYNTHESIZED SINUSOID)

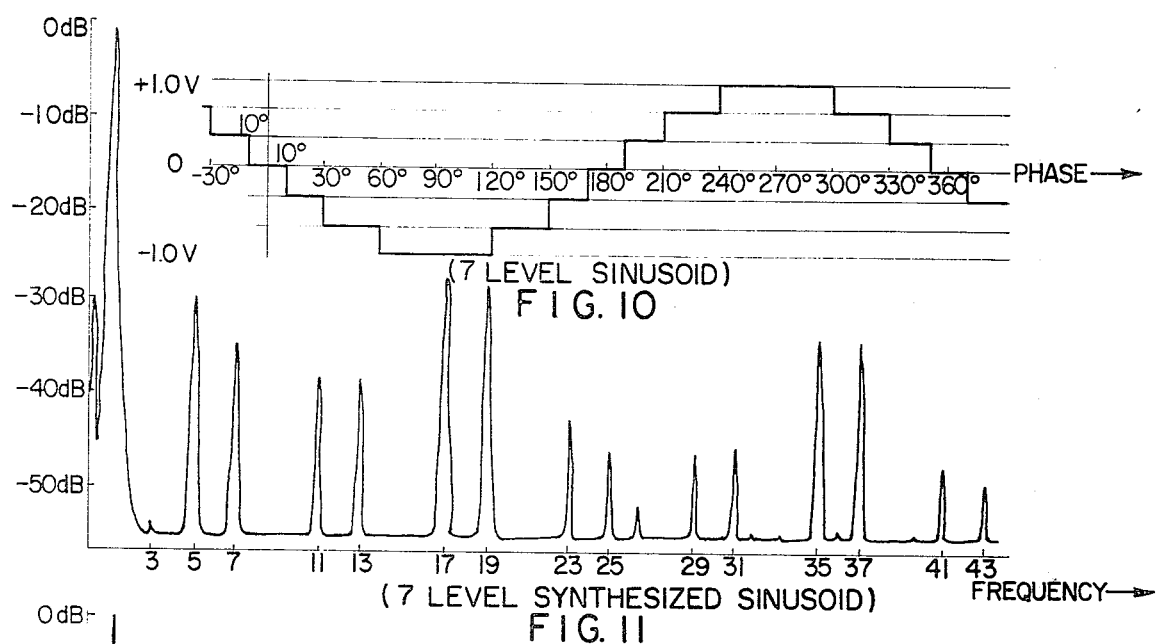
FIG. 10 (7 LEVEL SINUSOID)
FIG. 11 (7 LEVEL SYNTHESIZED SINUSOID)
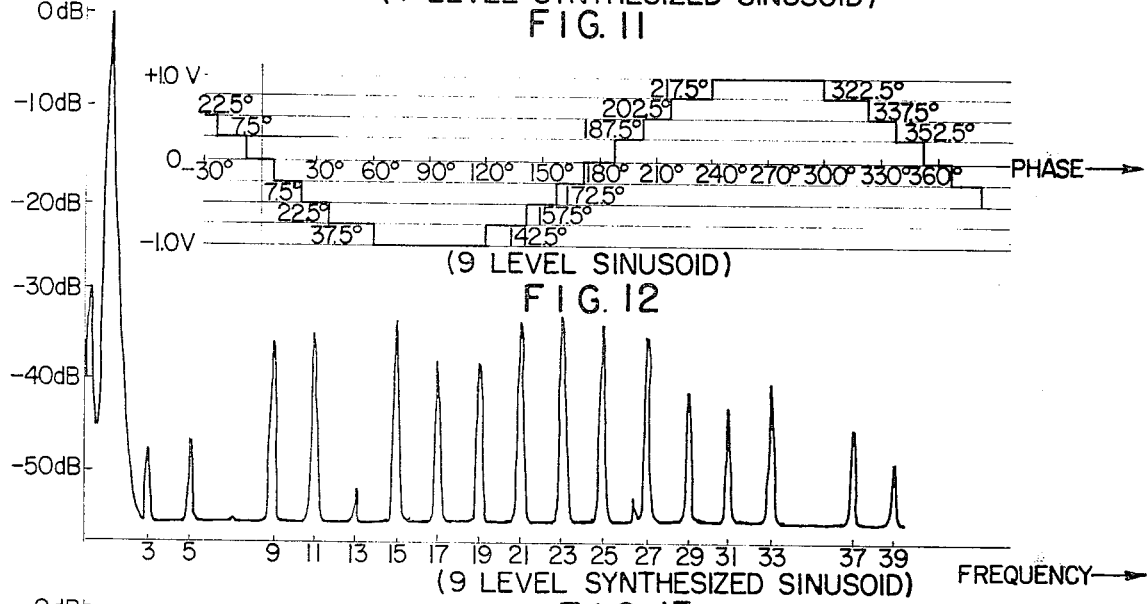
FIG. 12 (9 LEVEL SINUSOID)
FIG. 13 (9 LEVEL SYNTHESIZED SINUSOID)
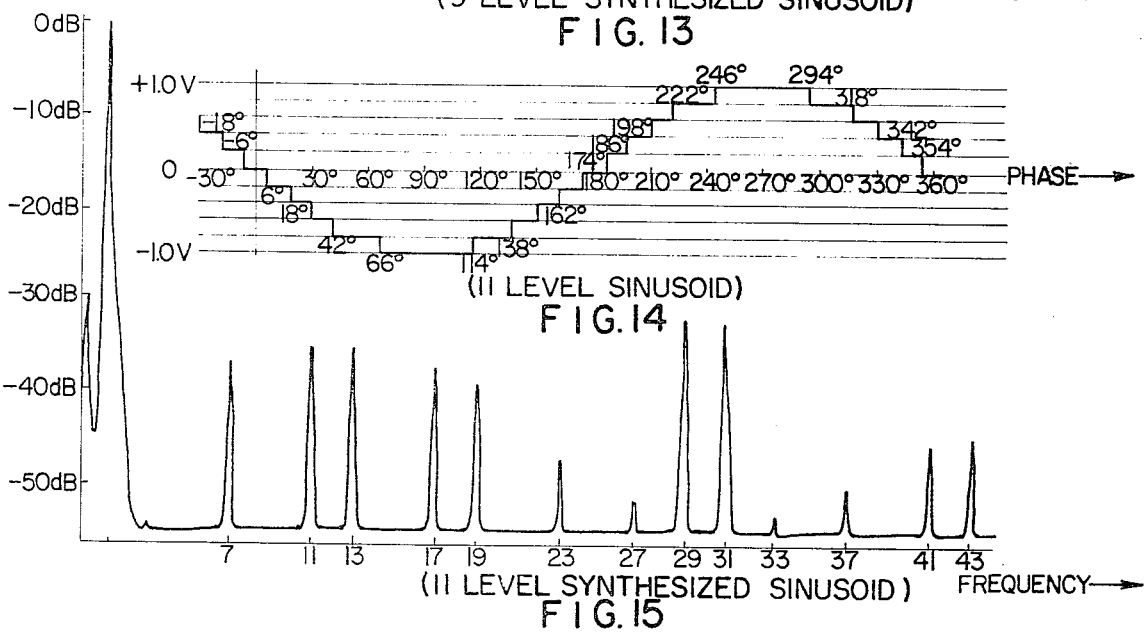
FIG. 14 (11 LEVEL SINUSOID)
FIG. 15 (11 LEVEL SYNTHESIZED SINUSOID)

SYNTHESIZED SINUSOID GENERATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to an apparatus for generating sinusoidal signals of high tonal purity and more particularly to a synthesized sinusoidal generator using a plurality of unity gain switching amplifiers.

In most communication systems, it is commonly necessary to have a source of high power single spectral line with a specified tonal purity to identify the harmonic amplitude limitations. For such a purpose, use of switching amplifiers is considered a logical choice. Since switching amplifiers have a theoretically infinite bandwidth, the spectral requirements must be fulfilled by synthesizing a quasi-sinusoidal wave form which will conform to the harmonic amplitude limitations of the desired single spectral line. The conventional methods develop the synthesized sinusoid by summing a fundamental square wave with its attenuated harmonics. These methods employ circuitry to generate the fundamental as well as the harmonics required thereof by each switching amplifier of the synthesized sinusoidal network. However, the energy contribution from each spectral component is unique. As an example, for an amplitude A for the fundamental of frequency $f_1$, the third harmonic amplitude would be attenuated to A/3 and the fifth harmonic amplitude to A/5, and so on. Thus such methods do not lend themselves to optimizing the power transfer because of the reduced power requirements of the harmonics. It is thus desirable to have a sinusoid generator where power requirements of the harmonics are not changed.

SUMMARY OF THE INVENTION

The synthesized sinusoid generator according to the teachings of subject invention includes a plurality of switching amplifiers of unity gain and involves summing various stages thereof at full power. This is accomplished by switching on and off various switching amplifiers as a function of time of the fundamental period. This necessitates only the generation of the fundamental frequency which, in conjunction with a delay network, switches on and off the designated unity gain switching amplifiers to produce the required synthesized sinusoid.

An object of subject invention is to have a synthesized sinusoid generator for developing a high powered single spectral line.

Another object of subject invention is to have a synthesized sinusoid generator which has a specified tonal purity and the harmonic amplitude limitations.

Still another object of subject invention is to have a synthesized sinusoid generator where the energy contribution from each spectral component is unique.

Another object of subject invention is to have a sinusoidal wave form generator where only the fundamental frequency is necessary to be generated.

Other objects, advantages, and novel features of the invention will become apparent from the following detailed description of the invention when considered in conjunction with the accompanying drawings wherein:

BRIEF DESCRIPTION OF THE DRAWINGS

FIGS. 4-15 are graphical representations of various level synthesized sinusoid generators and their corresponding spectra.

DESCRIPTION OF THE PREFERRED EMBODIMENT

Figure 2:
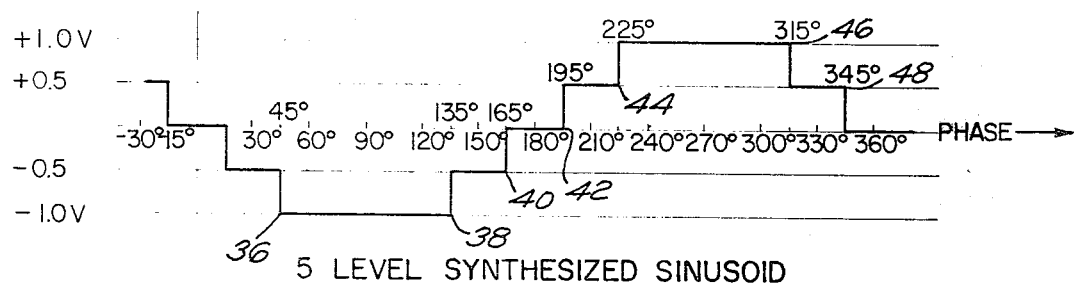
FIG. 2 is a graphical representation of amplitude variation versus the phase of a 5-level synthesized sinusoid generator.
Figure 3:
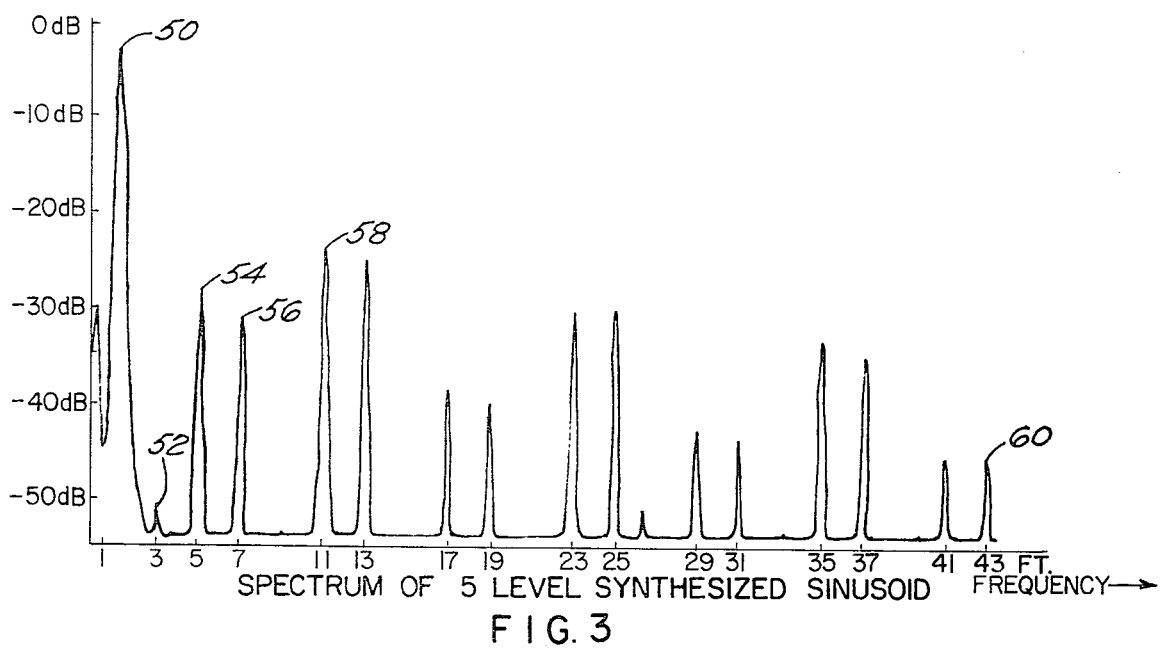
FIG. 3 represents amplitude variation versus frequency of a 5-level sinusoid generator.

The detailed description of constructional and operational features of one of the preferred embodiments constructed in accordance with the principle concept of the present invention will be given by referring to FIGS. 1, 2 and 3.

Figure 1:
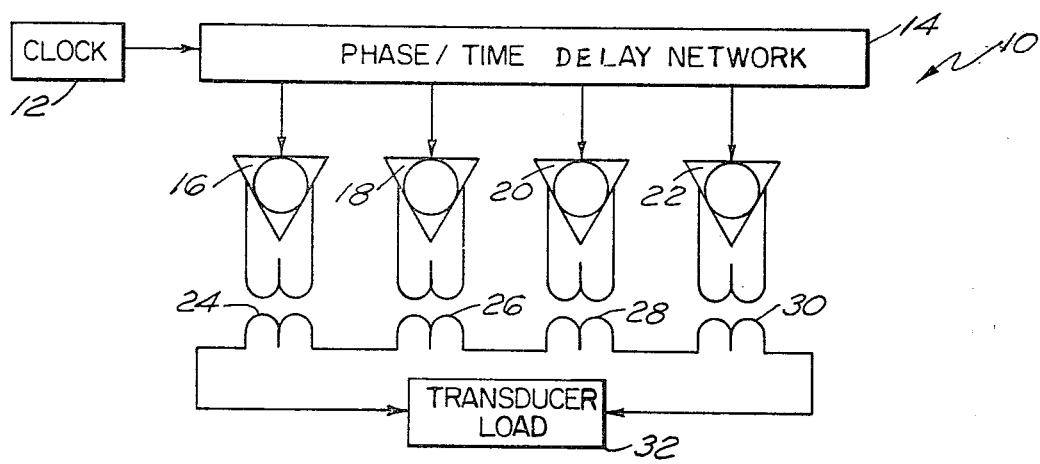
FIG. 1 is a block diagram of a sinusoid generator built according to the teachings of subject invention.

In FIG. 1, there is illustrated a schematic block diagram of a 5-level synthesized sinusoid generator 10 which includes a clock pulse generator 12, a phase/time delay network 14, unity gain switching amplifiers 16, 18, 20 and 22, transformers 24, 26, 28 and 30 having their corresponding secondaries connected in series and the output thereof connected to transducer load 32. Clock 12 provides the shift frequency to the phase/time delay network 14 which turns on/off the switching amplifiers 16, 18, 20 and 22 at their designated times as shown in FIG. 2. Each of switching amplifiers 16, 18, 20 and 22 provides unity gain through its corresponding transformer and the secondary of the transformers are combined and connected in series to the transducer load 32. The position of various switching amplifiers as a function of phase in a 5-level synthesized sinusoid is shown in FIG. 2 which is a graphical representation of the amplitude of the pulse versus the phase angle. As shown in FIG. 2, all unity gain amplifiers 16, 18, 20 and 22 are off at point 36 of the graph and they stay in that state until point 38 is reached when only amplifier 16 is turned on. At point 40 amplifier 18 is turned on besides amplifier 16 and this state exists until point 42 is reached when amplifier 20 is also turned on. At point 44 of the graph in FIG. 2, amplifier 22 is also turned on. Thus, all unity gain amplifiers 16, 18, 20 and 22 are turned on at point 44. They stay in that state until point 46 is reached when amplifier 16 is turned off. At point 48 amplifier 18 is also turned off besides amplifier 16 being turned off. This sequence is carried on until a point similar to point 36 on the graph is reached when all the amplifiers are turned off. The spectrum of a 5-level synthesized sinusoid, as shown in block diagram form in FIG. 1, is shown in FIG. 3 wherein peak 50 corresponds to the fundamental frequency f. Peaks 52, 54, 56, 58 and 60 corresponds to the frequecies of 3f, 5f, 7f, 11f and 43f respectively. FIG. 4 shows variation in amplitude versus phase of a 2-level sinusoid wherein only one unity gain amplifier is used. As shown in FIG. 4, the amplifier is in off-state starting at point 62, staying in that state until point 64 is reached when the unity gain amplifier is turned on. The spectral representation of the 2-level sinusoid is shown in FIG. 5 wherein peaks 66, 68, 70, 72, 74, 76 and 78 correspond respectively to frequencies f, 3f, 5f, 7f, 9f, 11f and 43f. The amplitude variation as a function of phase for a 3-level sinusoid is shown in FIG.

6 and the corresponding spectrum shown in FIG. 7. A 3-level sinusoid uses two unity gain amplifiers which are in the off-state at point 80 and at point 82 one of them is turned on while the other one is still in the off-position. At point 84 both of them are turned on. FIG. 7 is a graphical representation of the amplitude variation versus frequency wherein peaks 86, 88, 90 and 92 respectively correspond to frequency f, 3f, 5f and 43f. FIGS. 8 and 9 are the amplitude variation and spectrum for a 5-level sinusoid as shown in FIGS. 2 and 3 respectively. FIGS. 10 and 11, respectively, represent the amplitude variation of the pulse versus phase and the spectrum of a 7-level synthesized sinusoid. FIGS. 12 and 13 represent the amplitude variation with phase and the spectrum of a 9-level synthesized sinusoid which uses eight unity gain amplifiers. FIG. 14 is a representation for amplitude variation with phase for an 11-level sinusoid which uses ten unity gain amplifiers and FIG. 15 represents the spectrum of the 11-level sinusoid. As can be seen from FIG. 15, the amplitude of the fundamental of frequency f is much greater than that of any of its harmonics. Furthermore, in the case of each of these multilevel sinusoids, every unity gain switching amplifier stage presents full power to the load and thus maximizes the amplifier power transfer. The delayed addition of unity gain switching amplifier outputs to synthesize a sinusoidal signal to drive into an acoustic load is a unique feature of subject invention.

It should be noted that the hardware components; e.g., a clock, a phase/time delay network, unity gain switching amplifiers and the transfers; are all standard components and can be purchased from one of the many companies. The novelty of the device lies in the way the sinusoidal signals of particular frequency having a specified tonal purity and power are generated.

Briefly stated, a synthesized sinusoidal generator for delivering high power of a discrete spectral component according to the teachings of subject invention, includes a plurality of unity gain switching amplifiers receiving delayed input from a clock via a phase/time delay network. The delayed addition of the unity gain switching amplifier outputs is used to synthesize a sinusoidal signal of a specified tonal purity and power to drive an acoustic load.

Obviously, many modifications and variations of the present invention are possible in the light of above teachings. As an example, the hardware components used in the sinusoid generator can be substituted by their equivalents and the number of unity gain switching amplifiers can vary depending upon the tonal purity requirements. Furthermore, the teachings of subject invention can be implemented with many different circuit configurations. It is therefore understood that within the scope of the appended claims the invention may be practiced otherwise than as specifically described.

I claim:

1. A sinusoid generator for synthesizing a sinusoidal signal of a specified tonal purity which comprises:
   a clock for generating pulses of a preselected frequency as output thereof;
   a phase/time delay network receiving an input thereof from the output of said clock;
   a first plurality of equal gain switching amplifiers receiving inputs thereof from the output of said phase/time delay network sequentially as a function of the time period of said pulses of said clock and having means for providing equal amplitude output signals in response to the input signals; and
   a transducer load being coupled to the outputs of said first plurality of switching gain amplifiers.

2. The sinusoid generator of claim 1 wherein each of said first plurality of switching amplifiers is a unity gain switching amplifier.

3. The sinusoid generator of claim 2 wherein said transducer load is coupled to said first plurality of unity gain switching amplifiers by means of a second plurality of corresponding transformers, each member thereof having the primary thereof connected to the output of a corresponding unity gain switching amplifier of said first plurality of unity gain amplifiers and the secondary of each member thereof being connected in series with said transducer load.

4. The sinusoid generator of claim 3 wherein the tonal purity of the synthesized sinusoidal signal is dependent upon the number of members of said first plurality of unity gain switching amplifiers and said second plurality of corresponding transformers.

5. A method of synthesizing a sinusoidal signal of a specified tonal purity using a clock providing trigger pulses to a time/phase delay network used for a sequential on/off switching of a plurality of unity gain amplifiers coupled to a transducer load which comprises the steps of:
   generating pulses of a fixed frequency using said clock;
   energizing said time/phase delay network using pulses from said clock;
   activating various members of said plurality of unity gain switching amplifiers in a sequential manner determined by the output of said time/phase delay network;
   delivering equal amplitude signals from each activated member of said plurality of unity gain switching amplifiers; and
   combining the output of said plurality of unity gain switching amplifiers.

6. The method of claim 5 wherein the step of combining the output of said plurality of unity gain switching amplifiers further includes coupling the outputs of said plurality of unity gain switching amplifiers by using a plurality of corresponding transformers.

7. A sinusoid generator for synthesizing a sinusoidal signal of a specified tonal purity comprising:
   a clock for generating pulses of a preselected frequency as an output thereof;
   generating means for receiving an input from said clock and for providing a plurality of signals at respective output terminals, said plurality of output signals being equal in amplitude, and being provided and removed sequentially at non-uniform time intervals; and
   a plurality of transformers with each transformer having its primary winding connected to a respective output terminal of said generating means and each of the transformer secondary windings serially connected for delivering the synthesized sinusoidal signal.

8. A sinusoid generator for synthesizing a sinusoidal signal of a specified tonal purity according to claim 7 wherein said generating means further comprises:
   a phase/time delay network receiving an input from said clock; and
   a plurality of equal gain switching amplifiers connected to receive signals from said phase/time delay network.

* * * * *